United States Patent
Yanai

(10) Patent No.: US 7,532,543 B2
(45) Date of Patent: May 12, 2009

(54) ACOUSTIC SIGNAL GENERATING APPARATUS

(75) Inventor: Hiroyuki Yanai, Hyogo (JP)

(73) Assignee: Fujitsu Ten Limited, Hyogo (JP)

( * ) Notice: Subject to any disclaimer, the term of this patent is extended or adjusted under 35 U.S.C. 154(b) by 56 days.

(21) Appl. No.: 11/701,373

(22) Filed: Feb. 2, 2007

(65) Prior Publication Data

US 2007/0201706 A1  Aug. 30, 2007

(30) Foreign Application Priority Data

Feb. 28, 2006  (JP) .............................. 2006-053213

(51) Int. Cl.
  H04R 3/00   (2006.01)
  H03F 3/38   (2006.01)
  H03F 3/217  (2006.01)

(52) U.S. Cl. ...................... 367/137; 381/94.5

(58) Field of Classification Search ................ 367/137, 367/191; 381/94.5, 111, 117; 330/10, 251
See application file for complete search history.

(56) References Cited

U.S. PATENT DOCUMENTS 5,793,808 A * 8/1998 Rowe et al. ................. 375/238
6,563,376 B2 * 5/2003 Fujisawa ...................... 330/10
2003/0058040 A1 * 3/2003 Miyagaki et al. .............. 330/10
2006/0262843 A1 * 11/2006 Kim et al. ................... 375/238
2007/0121962 A1 * 5/2007 Adachi et al. .............. 381/94.5
2007/0201706 A1 * 8/2007 Yanai ......................... 381/117

FOREIGN PATENT DOCUMENTS

| JP | A 6-196940   | 7/1994 |
| JP | A-2003-110441| 4/2003 |
| JP | A 2003-158426| 5/2003 |
| JP | A-2004-222251| 8/2004 |

* cited by examiner

Primary Examiner—Dan Pihulic
(74) Attorney, Agent, or Firm—Oliff & Berridge, PLC

(57) ABSTRACT

A PWM signal generator is operable to generate a first pulse signal and a second pulse signal at least one of before and after generating the first pulse signal. A duty ratio of the second pulse signal is gradually changed. A low-pass filter is operable to convert the first pulse signal output from the PWM signal generator into an analog acoustic signal. The low-pass filter is operable to convert the second pulse signal output from the PWM signal generator into the analog acoustic signal having an inaudible frequency.

8 Claims, 8 Drawing Sheets

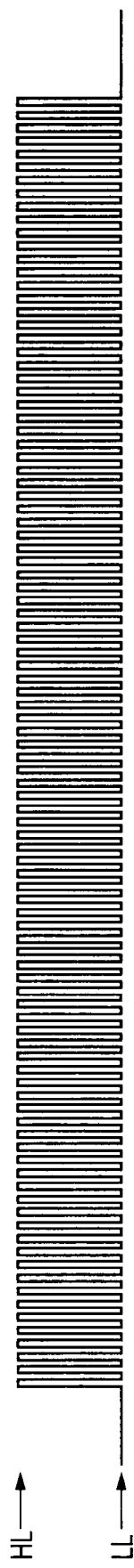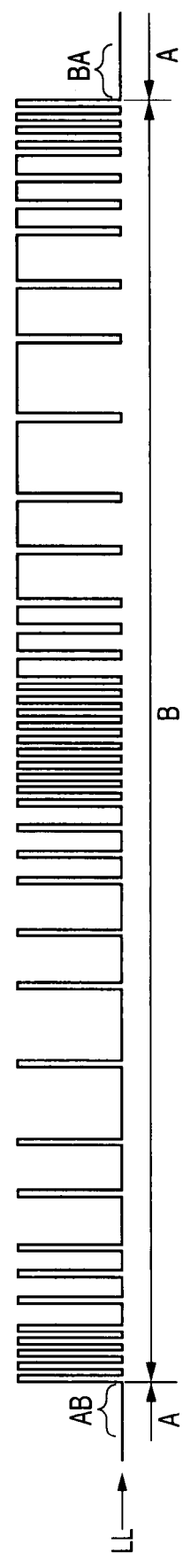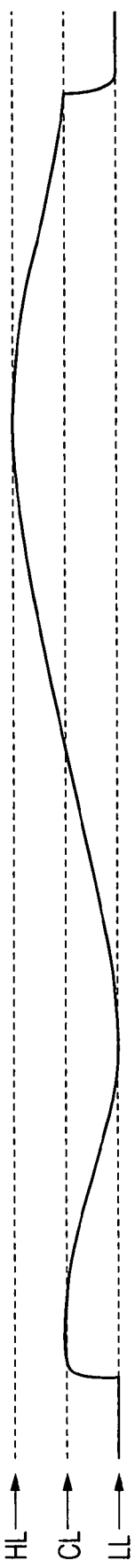

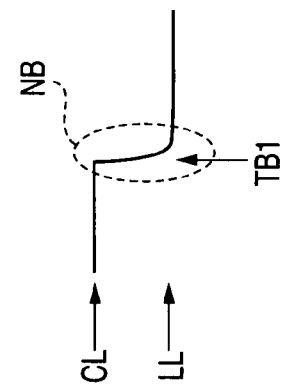
FIG. 3A
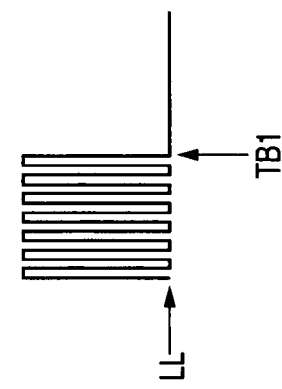
FIG. 3B
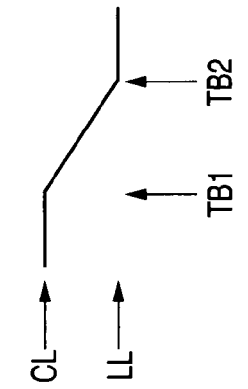
FIG. 3E
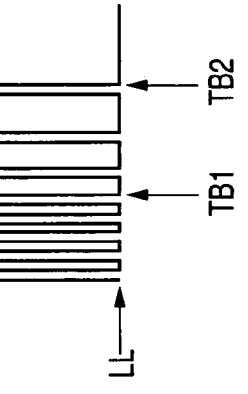
FIG. 3F
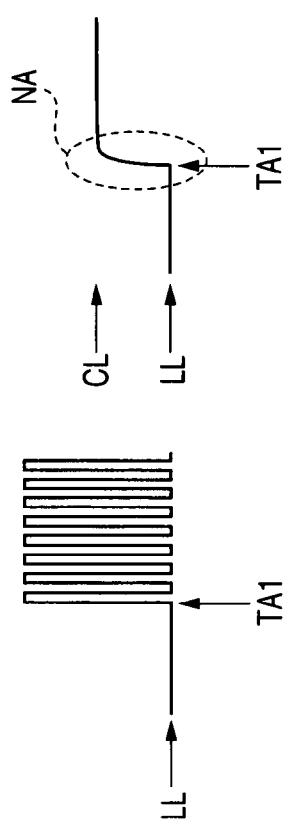
FIG. 3C
FIG. 3D
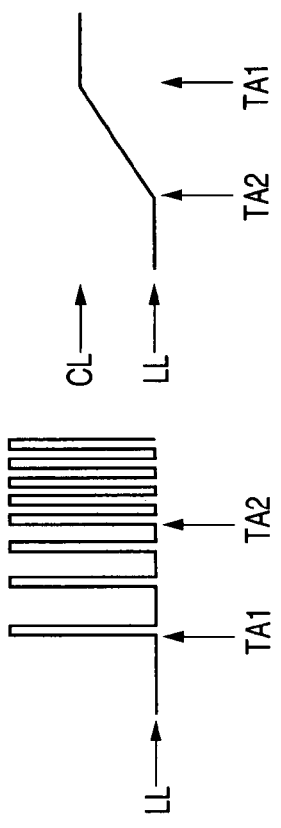
FIG. 3G
FIG. 3H

ACOUSTIC SIGNAL GENERATING APPARATUS

The disclosure of Japanese Patent Application No. 2006-053213 filed Feb. 28, 2006 including specification, drawings and claims is incorporated herein by reference in its entirety.

BACKGROUND OF THE INVENTION

This invention relates to an acoustic signal generating apparatus adopting a PWM (Pulse Wide Modulation) system converting the voltage amplitude of an acoustic signal into a digital pulse width based on digital acoustic data.

Hitherto, there is provided a pulse width modulation circuit for pulse width modulating a supplied carrier signal based on the level of an audio signal and a pulse width modulation amplification circuit for outputting an output pulse of the pulse width modulation circuit and an inversion pulse to a balanced transformerless amplification circuit including a low-pass filter for driving a loudspeaker.

In such a pulse width modulation amplification circuit, a pulse which becomes a carrier signal is output from the pulse width modulation circuit even in a state in which no audio signal is output and thus when power is turned on/off, shock noise caused by appearance/disappearance of the pulse occurs; this is a problem.

Japanese Patent Publication No. 6-196940A proposes an art of circuitry including a pulse width modulation circuit, an oscillator for oscillating output at a higher frequency than the frequency of a carrier signal supplied to the pulse width modulation circuit and synchronized with the carrier signal, a time constant circuit to which a power supply voltage is applied, conversion means for converting the oscillation output of the oscillator into output of a saw tooth wave, a level comparator for making a comparison between the output level of the time constant circuit and the output level from the conversion means, and an exclusive-OR circuit for inputting the output of the level comparator and the output of the pulse width modulation circuit, wherein the output of the exclusive-OR circuit and the output of the pulse width modulation circuit are output to a balanced transformerless amplification circuit.

According to the pulse width modulation amplification circuit described above, output to the balanced transformerless amplification circuit when the power is turned off and that when the power is shut off are placed in phase with each other and generation of shock noise on the load driven by the output of the pulse width modulation circuit and the output of the exclusive-OR circuit is eliminated.

In the pulse width modulation amplification circuit in the related art described above, however, the analog circuits of the conversion means and the time constant circuit need to be provided separately and to cope with the problem, digital signal processing is insufficient; this is a problem. If an audio signal is input, when the phase of the output of the exclusive-OR circuit is in a transition state, distortion occurs in the audio signal output to the load and thus muting must be applied for a given time period in the transition state; this is a problem.

An acoustic signal generating apparatus including oscillation means for generating a carrier signal of a predetermined frequency, PWM signal generator for pulse width modulating the carrier signal based on acoustic data, and a low-pass filter for converting a PWM signal output from the PWM signal generator into an analog acoustic signal without the above-described balanced transformerless amplification circuit cannot adopt the countermeasure based on phase adjustment described above; this is a problem.

If a signal is output from the PWM signal generator in synchronization before and after the pulse width modulating timing based on acoustic data and is fixed high or low in other time periods, the DC level of the low-pass filter fluctuates to the center level before and after the signal output time period and when the signal makes a center to high or low transition, shock noise occurs; this is also a problem.

SUMMARY OF THE INVENTION

It is therefore an object of the invention to provide an acoustic signal generating apparatus that can eliminate occurrence of shock noise caused by fluctuation of the DC level of a low-pass filter before or after the signal output time period from PWM signal generator.

In order to achieve the above described object, according to the invention there is provided an acoustic signal generating apparatus comprising:

a PWM signal generator, operable to generate a first pulse signal and a second pulse signal at least one of before and after generating the first pulse signal, wherein a duty ratio of the second pulse signal is gradually changed; and a low-pass filter, operable to convert the first pulse signal output from the PWM signal generator into an analog acoustic signal, and to convert the second pulse signal output from the PWM signal generator into the analog acoustic signal having an inaudible frequency.

The PWM signal generator may gradually increase the duty ratio of the second pulse signal before generating the first pulse signal.

The PWM signal generator may gradually decrease the duty ratio of the second pulse signal after generating the first pulse signal.

With this configuration, by the time the PWM signal generator outputs a first pulse signal based on acoustic data from a low or high level signal, modulation control is performed so that the output signal is changed in stages to a pulse signal from a small or large duty ratio to a large or small duty ratio at a frequency outside the auditory area, so that the DC level of the low-pass filter changes in stages to the center level before the PWM signal based on the acoustic data is output, and occurrence of shock noise can be circumvented.

In contrast, by the time the PWM signal generator outputs a low or high level signal at the termination of the first signal based on the acoustic data, modulation control is performed so that the output signal is changed in stages to a pulse signal from a large or small duty ratio to a small or large duty ratio at a frequency outside the auditory area, so that the DC level of the low-pass filter changes in stages to low or high level after the first signal based on the acoustic data is output, and occurrence of shock noise can be circumvented.

The PWM signal generator may smoothly change a duty ratio of the second pulse signal.

Although it is feared that some noise may occur due to the effect of harmonics contained in some of modulation signals changing the duty ratio of a pulse signal in stages, according to the above configuration, the duty ratio changes smoothly, so that steep change is circumvented, the noise component is sent away to the outside of the auditory area, and occurrence of shock noise can be circumvented reliably.

According to the invention, there is also provided an acoustic signal generating apparatus comprising:

a PWM signal generator, operable to generate a first pulse signal and a second pulse signal at least one of before and after generating the first pulse signal;

a low-pass filter, operable to convert the first pulse signal and the second pulse signal which are output from the PWM signal generator into an analog acoustic signal, wherein:

the second pulse signal has a predetermined duty ratio.

With this configuration, a second signal whose duty ratio is a predetermined value is output at all times before and after the PWM signal based on the acoustic data is output, so that the output DC level of the low-pass filter is maintained at the center level before and after output of the PWM signal based on the acoustic data and therefore occurrence of shock noise is eliminated.

According to the invention, there is also provided an acoustic signal generating apparatus comprising:

a PWM signal generator, operable to generate a pulse signal;

a low-pass filter, operable to convert the pulse signal output from the PWM signal generator into an analog acoustic signal;

a switcher, operable to switch an output terminal of the PWM signal generator between a signal output state and an output high impedance state; and a voltage regulator, maintaining the output terminal at a predetermined voltage when the output terminal is in the output high impedance state, wherein:

the PWM signal generator generates the pulse signal when the output terminal is in the signal output state; and the switcher switches the output terminal to the output high impedance state at least one of before and after generating the pulse signal.

With this configuration, the switcher switches the output terminal of the PWM signal generator to the high impedance state before or after the PWM signal based on the acoustic data is output, and accordingly the output DC level of the low-pass filter is maintained at the center level according to the DC voltage maintained by the voltage regulator and thus occurrence of shock noise is eliminated.

As described above, according to the invention, there can be provided an acoustic signal generating apparatus that can eliminate occurrence of shock noise caused by fluctuation of the DC level of a low-pass filter before or after the signal output time period from PWM signal generator.

BRIEF DESCRIPTION OF THE DRAWINGS

The above objects and advantages of the present invention will become more apparent by describing in detail preferred exemplary embodiments thereof with reference to the accompanying drawings, wherein:

FIG. 2A is a schematic diagram showing a waveform of a carrier signal;

FIG. 2B is a schematic diagram showing a waveform of a PWM signal;

FIG. 2C is a schematic diagram showing a waveform of an analog acoustic signal;

FIG. 3A is a schematic diagram showing the waveform of the PWM signal in the vicinity of the audio playback start time;

FIG. 3B is a schematic diagram showing the waveform of the analog acoustic signal corresponding to FIG. 3A;

FIG. 3C is a schematic diagram showing the waveform of the PWM signal in the vicinity of the audio playback start time according to a first embodiment of the invention;

FIG. 3D is a schematic diagram showing the waveform of the analog acoustic signal corresponding to FIG. 3C;

FIG. 3E is a schematic diagram showing the waveform of the PWM signal in the vicinity of the audio playback termination time;

FIG. 3F is a schematic diagram showing the waveform of the analog acoustic signal corresponding to FIG. 3E;

FIG. 3G is a schematic diagram showing the waveform of the PWM signal in the vicinity of the audio playback termination time according to the first embodiment;

FIG. 3H is a schematic diagram showing the waveform of the analog acoustic signal corresponding to FIG. 3G;

DETAILED DESCRIPTION OF THE EMBODIMENTS

Hereinafter, embodiments applying an acoustic signal generating apparatus according to the invention to a vehicle-installed audio apparatus will be described in detail.

The vehicle-installed audio apparatus is an apparatus installed in a vehicle for the purposes of listening to music, viewing video, and further demonstrating the function of an output unit of a car navigation system for displaying map information and outputting a navigation message, etc., and provides the driver, etc., of the vehicle with information of sound, images, etc., recorded on media such as a CD or a DVD inserted into the vehicle-installed audio apparatus or a memory card or information of sound, images, etc., received through an antenna from a loudspeaker or on a monitor included in the vehicle-installed audio apparatus.

Figure 1:
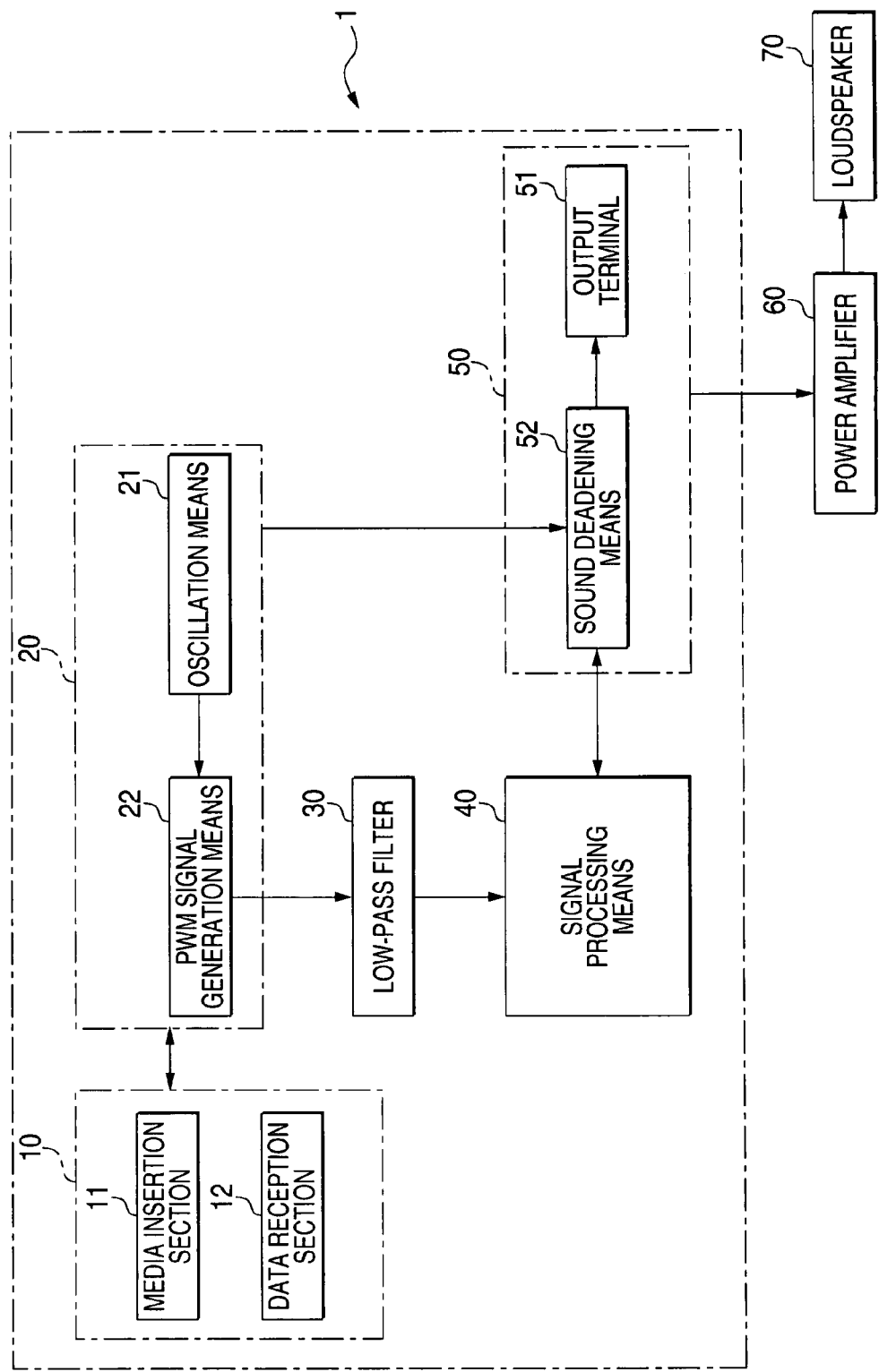
FIG. 1 is a block diagram showing a configuration of an acoustic signal generating apparatus of the invention.

An acoustic signal generating apparatus 1 as the vehicle-installed audio apparatus is made up of an external data input section 10 for inputting data of sound, an image, etc., from the media, the antenna, etc., a control section 20 for generating a PWM signal (described later) based on the acoustic data input from the external data input section 10 and controlling the operation of the acoustic signal generating apparatus, a low-pass filter 30 for converting the PWM signal output from the control section 20 into an analog acoustic signal, signal processing means 40 for performing various types of processing for the analog acoustic signal, and an acoustic signal output section 50 for outputting the analog acoustic signal, as shown in FIG. 1. The acoustic signal output section 50 is connected to a power amplifier 60 for outputting an audible sound from a loudspeaker 70.

The external data input section 10 includes a media insertion section 11 for inputting data as a medium such as a CD recording music data, a DVD recording map data, or the like is inserted and a data reception section 12 for selecting the channel of a digital TV broadcast, etc., received at the antenna and demodulates the digital TV broadcast, etc., so that data of sound, images, etc., from media and broadcasts can be input.

The control section 20 controls the operation of the acoustic signal generating apparatus 1 and generates a PWM signal (described later) based on the acoustic data input from the external data input section 10. More particularly, the control section 20 is connected to components of the acoustic signal generating apparatus 1 requiring control by control signal lines not shown in FIG. 1 and sends control signals to the components as the operation timing, the operation time, the operation description, or the like. Generating the PWM signal is described later in detail.

The low-pass filter 30 converts the PWM signal output from the control section 20 into an analog acoustic signal, as described later in detail.

The signal processing means 40 performs various types of processing for the analog acoustic signal output from the low-pass filter 30. For example, it performs volume control based on amplification or attenuation of the analog acoustic signal, sound quality control by increasing or decreasing the gain for each frequency band of the analog acoustic signal, BBE sound quality control of recovering a time delay, amplitude disorder, etc., occurring in the analog acoustic signal by executing phase correction, high-frequency amplification, etc., in combination for maintaining the acoustic output waveform close to the waveform of the original sound, and the like.

The acoustic signal output section 50 outputs the analog acoustic signal; more particularly, it is made up of an acoustic signal output terminal 51 for connection to an external amplifier, etc., and sound deadening means 52 for stopping (muting) output of the analog acoustic signal. An RCA terminal can be named as an example of the acoustic signal output terminal 51. The sound deadening means 52 shuts off output of the analog acoustic signal from the acoustic signal output terminal 51 at a predetermined timing as the driver, etc., of the vehicle operates a sound deadening switch (not shown) installed in the acoustic signal generating apparatus 1 or under the control of the control section 20.

The power amplifier 60 is connected to the acoustic signal output section 50 and amplifies the analog acoustic signal for output to the loudspeaker 70.

The control section 20 and the low-pass filter 30 will be discussed below:

The control section 20 is made up of oscillation means 21 for generating a carrier signal of a predetermined frequency and PWM signal generator 22 for pulse width modulating the carrier signal based on acoustic data.

The oscillation means 21 generates a carrier signal of a predetermined frequency and executes oscillation output of pulse wave of a given frequency of 80 kHz and a given amplitude with repetitions of high level HL and low level LL as the same duration, namely, at duty ratio 1/2, as shown in FIG. 2A. In the embodiments, rectangular pulse wave is used, but the invention is not limited to the rectangular pulse wave; any other pulse wave such as an integration wave or a staircase wave may be output if the waveform can be subjected to duty ratio modulation.

The acoustic data is implemented as digital acoustic data of PCM (Pulse Code Modulation), etc., and the PWM signal generator 22 modulates the duty ratio of the carrier signal, namely, executes PWM modulation based on the acoustic data for output.

Modulation is executed so that the larger the signal value of the acoustic data, namely, the closer the signal value to the positive maximum amplitude value, the larger the duty ratio; modulation is executed so that the smaller the signal value of the acoustic data, namely, the closer the signal value to the negative maximum amplitude value, the smaller the duty ratio; and modulation is executed so that the duty ratio becomes 1/2 if the signal value of the acoustic data is zero.

That is, the PWM signal generator 22 converts the acoustic data into duty ratio data and modulates the carrier signal of the duty ratio 1/2 based on the provided duty ratio data, thereby generating a PWM signal as shown in FIG. 2B.

The control section 20 can be made up of ROM containing a control program, RAM for storing the acoustic data, and a CPU, for example; the oscillation means 21 can be implemented as a block for operating an internal timer of the CPU and generating the carrier signal based on the control program and the PWM signal generator 22 can be implemented as a block for reading the acoustic data stored in the RAM and PWM modulating the carrier signal based on the control program.

The acoustic data input from the external data input section 10 is stored in the RAM; fixed acoustic data previously stored in the ROM can also be used as the acoustic data. The acoustic data input from the external data input section 10 can be input by DMA (Direct Memory Access) transfer operated at a predetermined timing. The control section 20 can input the acoustic data into the RAM at a predetermined timing and can generate and output a PWM signal based on the input acoustic data.

Therefore, the control section 20 can acquire the acoustic data by DMA transfer at the timing at which a PWM signal needs to be output and can generate the carrier signal and then can PWM modulate the carrier signal based on the input acoustic data and output the signal and at the termination of the output, can stop the carrier signal. In this case, the carrier signal is generated in synchronization before and after the pulse width modulating timing based on the acoustic data and is output from the PWM signal generator 22 and is fixed high or low in other time periods.

The low-pass filter 30 converts the PWM signal generated by the PWM signal generator 22 into an analog acoustic signal. More particularly, the conversion processing is as follows: If the duty ratio of the PWM signal is larger than 1/2, the PWM signal is converted into an analog signal of a positive signal value whose absolute value is larger as the duty ratio is larger; if the duty ratio of the PWM signal is 1/2, the PWM signal is converted into an analog signal whose signal value is zero; and if the duty ratio of the PWM signal is smaller than 1/2, the PWM signal is converted into an analog signal of a negative signal value whose absolute value is larger as the duty ratio is smaller. That is, fluctuation of the duty ratio in the PWM signal is converted into fluctuation of the magnitude of the signal value, whereby the PWM signal as shown in FIG. 2B is converted into an analog acoustic signal as shown in FIG. 2C. As the analog acoustic signal, an analog signal of a value between high level HL when the duty ratio of the PWM signal is the maximum and low level LL when the duty ratio of the PWM signal is the minimum with center level CL as the reference signal voltage is output.

As described above, if a signal is output from the PWM signal generator in synchronization before and after the pulse width modulating timing based on the acoustic data and is fixed high or low in other time periods, the DC level of the low-pass filter fluctuates to the center level before and after the signal output time period and when the signal makes a center to high or low transition, shock noise occurs.

Then, in the invention, the PWM signal generator 22 changes the carrier signal before or after executing pulse width modulation based on the acoustic data, thereby circumventing occurrence of shock noise. In the description to follow, it is assumed that the signal level before or after pulse width modulation based on the acoustic data is low; however, similar description is also applied if the signal level is high.

A first embodiment is an embodiment wherein the PWM signal generator 22 changes the duty ratio of the carrier signal in stages at a frequency outside the auditory area in a section AB just before a transition is made from an audio non-playback section A to an audio playback section B in FIG. 2B or a section BA just after a transition is made from the audio playback section B to the audio non-playback section A.

More particularly, in the case where the PWM signal generator 22 executes pulse width modulation based on acoustic data when audio playback is started, if the PWM signal is changed from low level LL to a pulse wave of duty ratio 1/2 at timing TA1 as shown in FIG. 3A, shock noise NA occurs in the process in which the output analog acoustic signal changes from low level LL to center level CL as shown in FIG. 3B.

In the first embodiment, however, the duty ratio of the PWM signal is changed in stages from timing TA2 preceding the timing TA1 as shown in FIG. 3C, whereby the output analog acoustic signal changes gently from low level LL to center level CL as shown in FIG. 3D. That is, the frequency of the analog acoustic signal becomes low at the gently changing timing; in the embodiment, the change percentage of the duty ratio of the PWM signal is lessened, whereby the change percentage of the analog acoustic signal is lessened, so that the frequency of the analog acoustic signal becomes a frequency outside the auditory area lower than the frequency in the auditory area.

On the other hand, in the case where the PWM signal generator 22 executes pulse width modulation based on acoustic data when audio playback terminates, if the PWM signal is changed from a pulse wave of duty ratio 1/2 to low level LL at timing TB1 as shown in FIG. 3E, shock noise NB occurs in the process in which the output analog acoustic signal changes from center level CL to low level LL as shown in FIG. 3F.

In the first embodiment, however, the duty ratio of the PWM signal is changed in stages from the timing TB1 to timing TB2 following the timing TB1 as shown in FIG. 3G, whereby the output analog acoustic signal changes gently from center level CL to low level LL as shown in FIG. 3H. That is, the frequency of the analog acoustic signal becomes low at the gently changing timing; in the embodiment, the change percentage of the duty ratio of the PWM signal is lessened, whereby the change percentage of the analog acoustic signal is lessened, so that the frequency of the analog acoustic signal becomes a frequency outside the auditory area lower than the frequency in the auditory area.

To realize the step-by-step change of the duty ratio described above, the control section 20 performs control so as to increment or decrement the duty ratio by a given value in a given time period.

A second embodiment is an embodiment wherein the PWM signal generator 22 smoothly changes the duty ratio of the carrier signal in accordance with the sine wave characteristic at a frequency outside the auditory area in the section AB or the section BA in FIG. 2B.

Figure 4B:
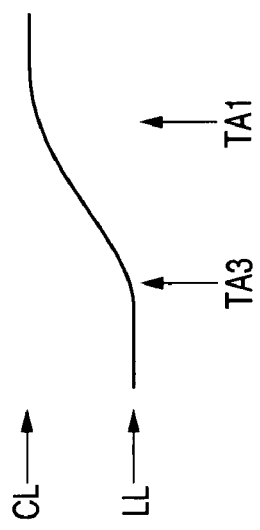
FIG. 4B is a schematic diagram showing the waveform of the analog acoustic signal corresponding to FIG. 4A.
Figure 4D:
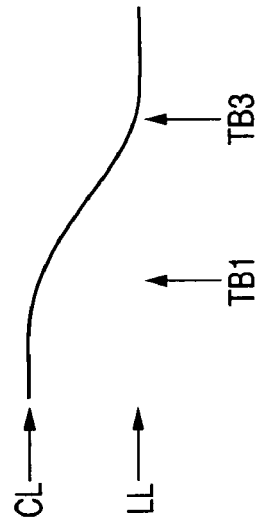
FIG. 4D is a schematic diagram showing the waveform of the analog acoustic signal corresponding to FIG. 4C.
Figure 4A:
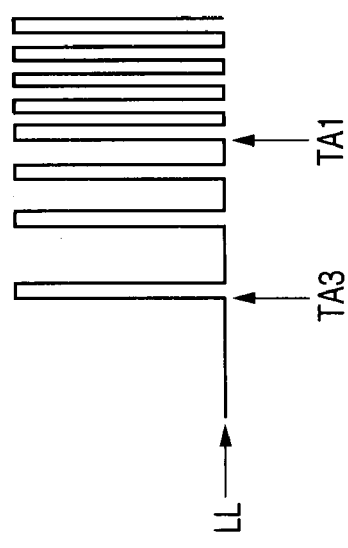
FIG. 4A is a schematic diagram showing the waveform of the PWM signal in the vicinity of the audio playback start time according to a second embodiment of the invention.

More particularly, when audio playback is started, in the cases in FIG. 3A and FIG. 3B, shock noise NA occurs in the process in which the output analog acoustic signal changes from low level LL to center level CL. In the second embodiment, however, the duty ratio of the PWM signal is smoothly changed in accordance with the sine wave characteristic from timing TA3 preceding the timing TA1 as shown in FIG. 4A whereby the output analog acoustic signal changes gently from low level LL to center level CL as shown in FIG. 4B. That is, the frequency of the analog acoustic signal becomes low at the gently changing timing; in the embodiment, the change percentage of the duty ratio of the PWM signal is lessened, whereby the change percentage of the analog acoustic signal is lessened, so that the frequency of the analog acoustic signal becomes a frequency outside the auditory area lower than the frequency in the auditory area.

Figure 4C:
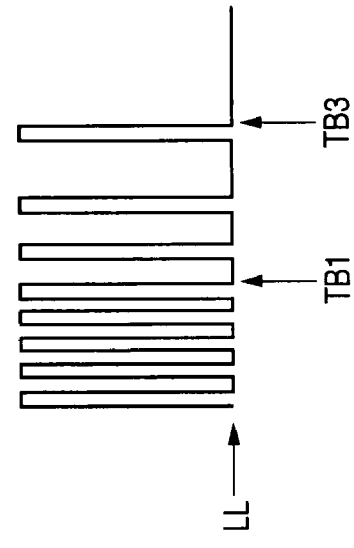
FIG. 4C is a schematic diagram showing the waveform of the PWM signal in the vicinity of the audio playback termination time according to the second embodiment.

On the other hand, when audio playback terminates, in the cases in FIG. 3E and FIG. 3F, shock noise NB occurs in the process in which the output analog acoustic signal changes from center level CL to low level LL. In the second embodiment, however, the duty ratio of the PWM signal is smoothly changed in accordance with the sine wave characteristic from the timing TB1 to timing TB3 following the timing TB1 as shown in FIG. 4C, whereby the output analog acoustic signal changes gently from center level CL to low level LL as shown in FIG. 4D. That is, the frequency of the analog acoustic signal becomes low at the gently changing timing; in the embodiment, the change percentage of the duty ratio of the PWM signal is lessened, whereby the change percentage of the analog acoustic signal is lessened, so that the frequency of the analog acoustic signal becomes a frequency outside the auditory area lower than the frequency in the auditory area.

To realize the smooth change of the duty ratio in accordance with the sine wave characteristic described above, the control section 20 performs control to determine the change amount of the duty ratio by performing processing of calculating and outputting the change amount between an initial value and a last value according to a sine wave function every given time period with the initial value of the duty ratio set to 0 and the last value set to 1/2, for example.

A third embodiment is an embodiment wherein the PWM signal generator 22 always outputs a carrier signal whose duty ratio is 1/2 regardless of the state in the section A or the section B in FIG. 2B.

Figure 5A:
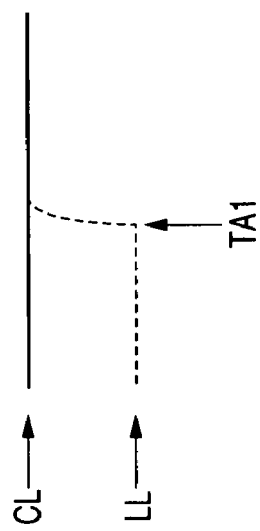
FIG. 5A is a schematic diagram showing the waveform of the PWM signal in the vicinity of the audio playback start time according to a third embodiment of the invention.
Figure 5B:
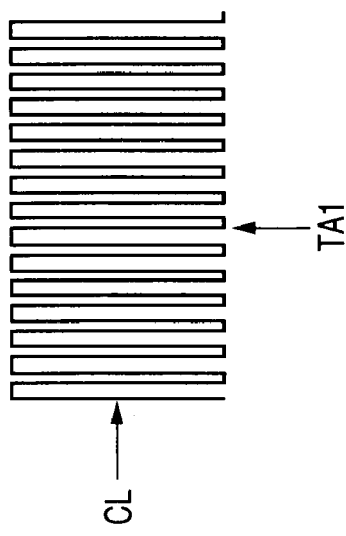
FIG. 5B is a schematic diagram showing the waveform of the analog acoustic signal corresponding to FIG. 5A.

More particularly, when audio playback is started, in the cases in FIG. 3A and FIG. 3B, shock noise NA occurs in the process in which the output analog acoustic signal changes from low level LL to center level CL. In the third embodiment, however, the oscillation means 21 always outputs a carrier signal whose duty ratio is 1/2 regardless of the timing, namely, setting a state in which no low level LL exists in the carrier signal as shown in FIG. 5A, whereby the output analog acoustic signal is always maintained at center level CL as indicated by the solid line in FIG. 5B. That is, there is no difference between the low level LL and the center level CL in the audio non-playback state and the audio playback state as indicted by the dotted line in FIG. 5B and therefore the shock noise NA does not occur.

Figure 5C:
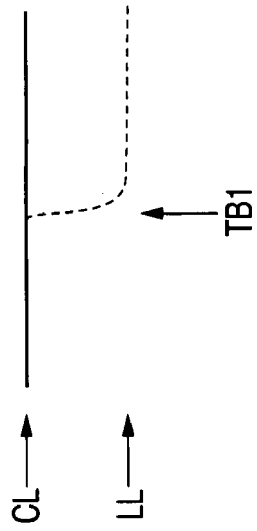
FIG. 5C is a schematic diagram showing the waveform of the PWM signal in the vicinity of the audio playback termination time according to the third embodiment.
Figure 5D:
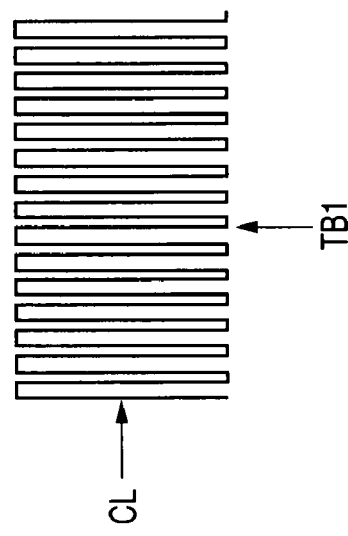
FIG. 5D is a schematic diagram showing the waveform of the analog acoustic signal corresponding to FIG. 5C.

On the other hand, when audio playback terminates, in the cases in FIG. 3E and FIG. 3F, shock noise NB occurs in the process in which the output analog acoustic signal changes from center level CL to low level LL. In the third embodiment, however, the oscillation means 21 always outputs a PWM signal whose duty ratio is 1/2 regardless of the timing, namely, setting a state in which no low level LL exists in the carrier signal as shown in FIG. 5C, whereby the output analog acoustic signal is always maintained at center level CL as indicated by the solid line in FIG. 5D. That is, there is no difference between the center level CL and the low level LL in the audio playback state and the audio non-playback state as indicted by the dotted line in FIG. 5C and therefore the shock noise NB does not occur.

In the third embodiment, when the power of the acoustic signal generating apparatus 1 is on, a carrier signal whose duty ratio is 1/2 is always output from the oscillation means 21 regardless of whether or not audio playback is executed; the power of the acoustic signal generating apparatus 1 is off, the carrier signal is not output. Therefore, shock noise occurs when the power of the acoustic signal generating apparatus 1 is switched from off to on or from on to off. In the third embodiment, however, when the power state is switched, the sound deadening means 52 shuts off output of the analog acoustic signal, whereby occurrence of the shock noise is circumvented.

Next, a fourth embodiment of the invention will be described. Components similar to those in the first embodiment will be designated by the same reference numerals and repetitive explanations for those will be omitted.

Figure 6:
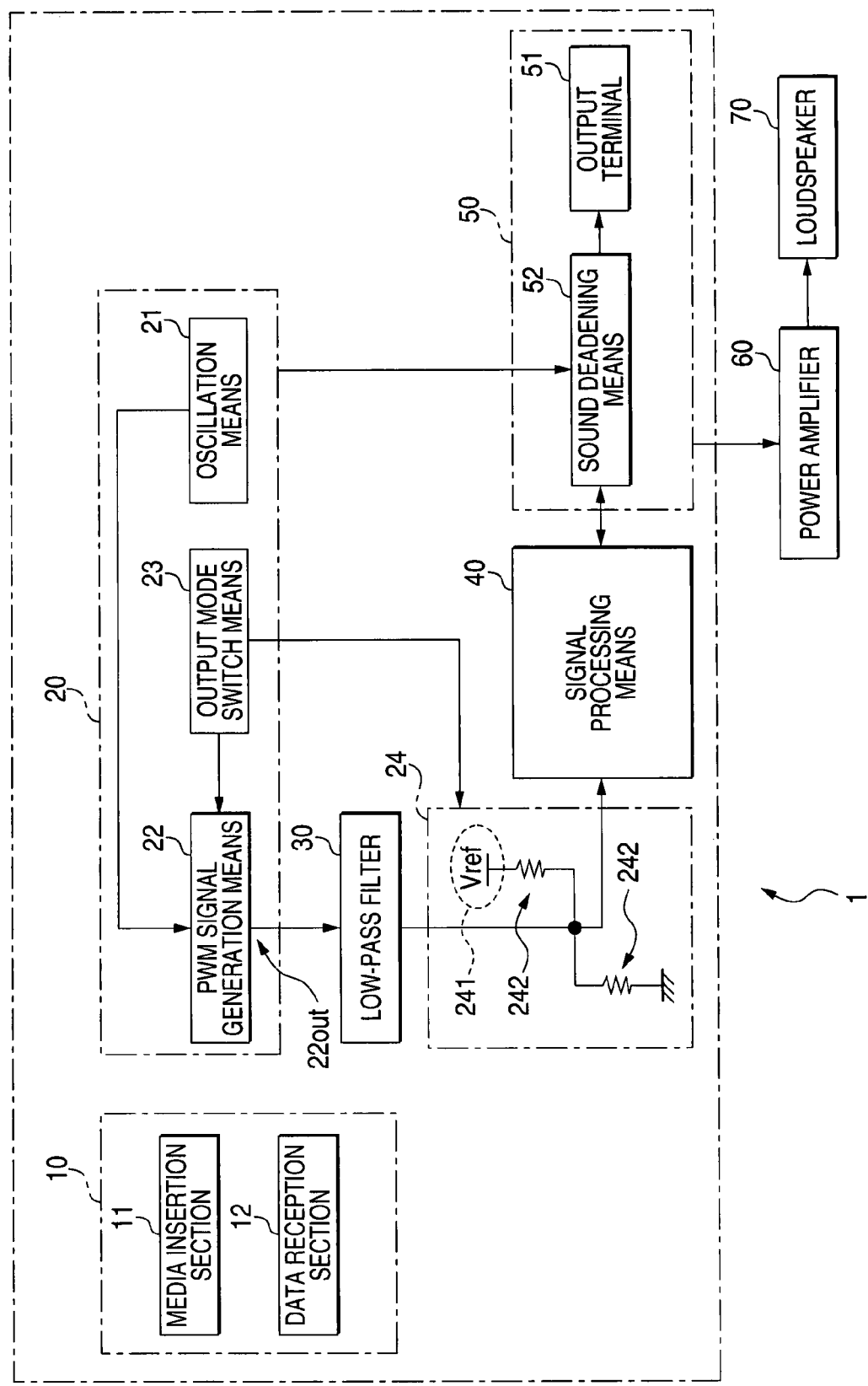
FIG. 6 is a block diagram showing a configuration of an acoustic signal generating apparatus according to a fourth embodiment of the invention.

The fourth embodiment is an embodiment wherein an output terminal 22 out of the PWM signal generator 22 can be switched between a signal output state and an output high impedance state and output mode switch means 23 for switching the output terminal 22 out to the output high impedance state at least before or after output of a PWM signal based on acoustic data and DC voltage adjustment means 24 for maintaining the output terminal 22 out at a predetermined DC voltage value when the output mode switch means 23 switches the output terminal 22 out to the output high impedance state, as shown in FIG. 6.

The output mode switch means 23 switches the output terminal 22 out to the output high impedance state at least before or after output of a PWM signal based on acoustic data. More particularly, the output mode switch means 23 switches the output terminal 22 out of the PWM signal generator 22 to input before or after output of the PWM signal, namely, in the section A in FIG. 2B. As the output terminal 22 out is switched to input, the terminal voltage of the output terminal 22 out depends on an external circuit. As the external circuit, a circuit for maintaining the terminal voltage of the output terminal 22 out at a predetermined value is the DC voltage adjustment means 24 described just below:

The DC voltage adjustment means 24 maintains the output terminal 22 out at a predetermined DC voltage value when the output mode switch means 23 switches the output terminal 22 out to the output high impedance state. For example, the DC voltage adjustment means 24 is made up of reference voltage generation means 241 for generating a reference voltage Vref of the same value as high level HL of the maximum signal value of an analog acoustic signal and two resistors 242 for dividing the reference voltage Vref to generate a voltage of the same value as center level CL of a reference signal voltage of the analog acoustic signal.

Figure 7B:
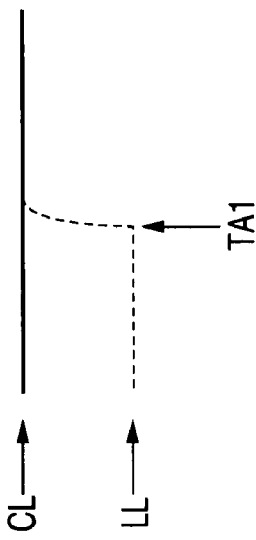
FIG. 7B is a schematic diagram showing the waveform of the analog acoustic signal corresponding to FIG. 7A.
Figure 7D:
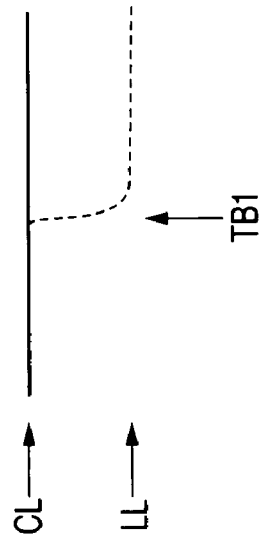
FIG. 7D is a schematic diagram showing the waveform of the analog acoustic signal corresponding to FIG. 7C.
Figure 7A:
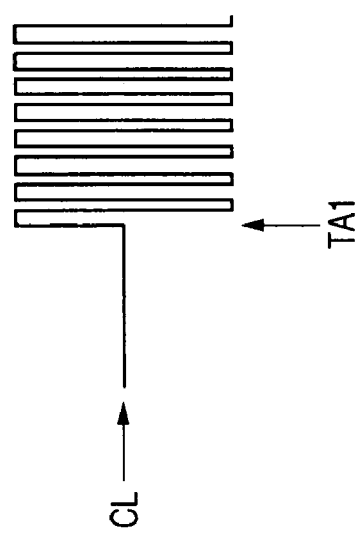
FIG. 7A is a schematic diagram showing the waveform of the PWM signal in the vicinity of the audio playback start time according to the fourth embodiment.

The operation of the fourth embodiment will be discussed in detail. When audio playback is started, in the cases in FIG. 3A and FIG. 3B, shock noise NA occurs in the process in which the output analog acoustic signal changes from low level LL to center level CL. In the fourth embodiment, however, as shown in FIG. 7A, before the timing TA1, the output terminal 22 out of the PWM signal generator 22 is switched to input by the output mode switch means 23 and is maintained at the center level CL by the DC voltage adjustment means 24; after the timing TA1, the output terminal 22 out is switched to output and the PWM signal is output. That is, the analog acoustic signal provided by converting the signal shown in FIG. 7A through the low-pass filter 30 is maintained at the center level CL regardless of whether the timing is before or after the timing TA1 as indicated by the solid line in FIG. 7B and therefore the shock noise NA does not occur.

Figure 7C:
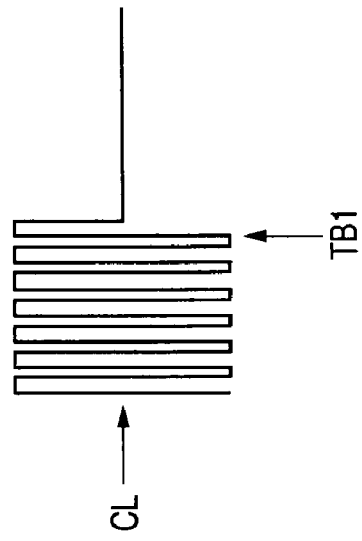
FIG. 7C is a schematic diagram showing the waveform of the PWM signal in the vicinity of the audio playback termination time according to the fourth embodiment.

On the other hand, when audio playback terminates, in the cases in FIG. 3E and FIG. 3F, shock noise NB occurs in the process in which the output analog acoustic signal changes from center level CL to low level LL. In the fourth embodiment, however, as shown in FIG. 7C, before the timing TB1, the output terminal 22 out is switched to output and the PWM signal is output; after the timing TB1, the output terminal 22 out of the PWM signal generator 22 is switched to input by the output mode switch means 23 and is maintained at the center level CL by the DC voltage adjustment means 24 as described above. That is, the analog acoustic signal provided by converting the signal shown in FIG. 7C through the low-pass filter 30 is maintained at the center level CL regardless of whether the timing is before or after the timing TB1 as shown in FIG. 7D and therefore the shock noise NB does not occur.

Figure 8:
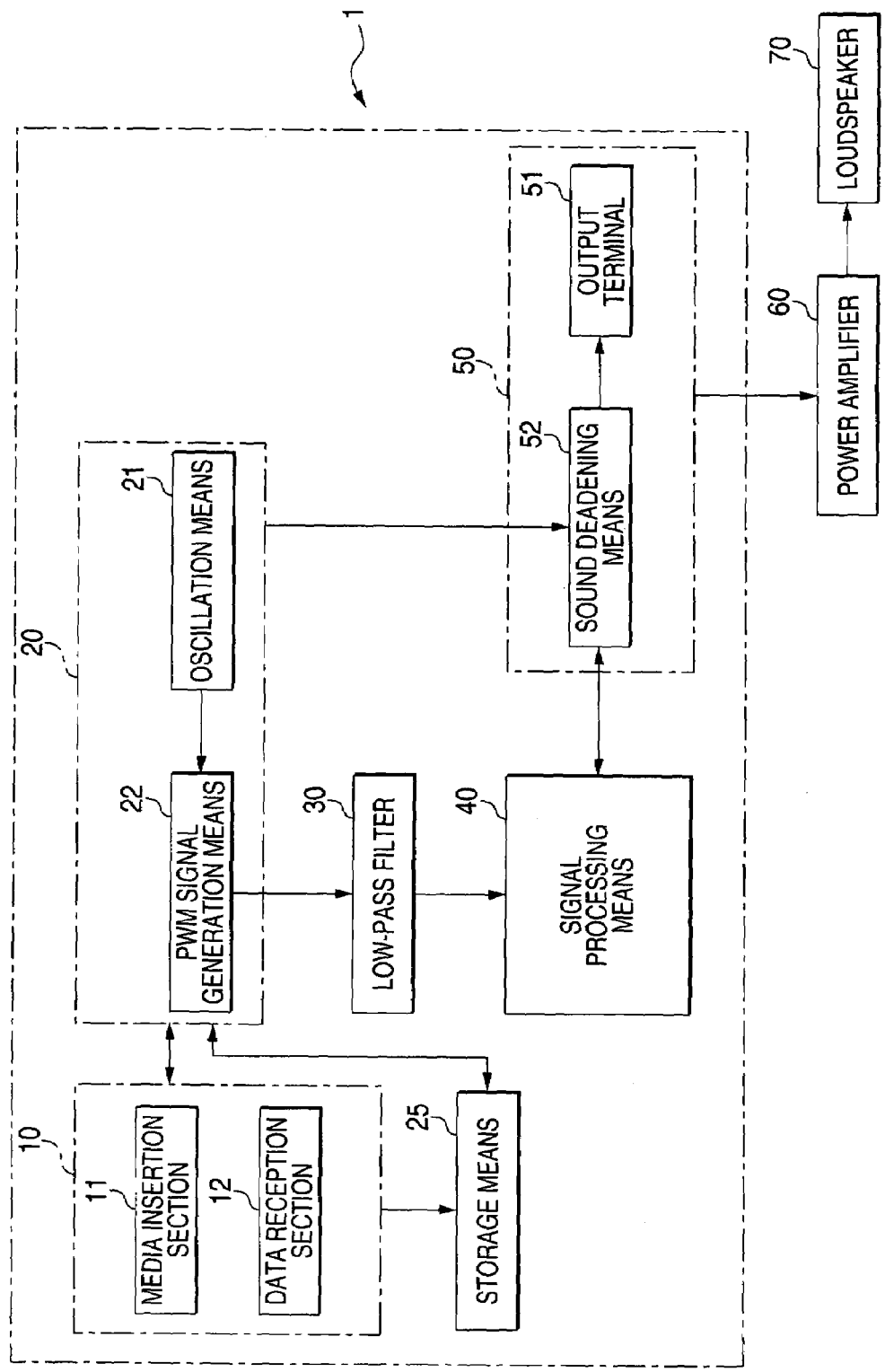
FIG. 8 is a block diagram showing a configuration of an acoustic signal generating apparatus including storage means.

Another embodiment will be discussed. In the given-above description of the embodiments, the control section 20 is provided with the RAM and data is acquired directly from the external data input section 10. A configuration as shown in FIG. 8 is also possible wherein external large-capacity storage means 25 is provided and acoustic data input from the external data input section 10 is temporarily stored in the storage means 25 and the control section 20 executes DMA transfer of the acoustic data at the timing at which the acoustic data becomes necessary.

According to the configuration, for example, if the acoustic data input from the external data input section 10 cannot all be stored in the RAM because the acoustic data is large-capacity data, it is made possible to handle the large-capacity data as the control section 20 directly accesses the storage means 25 and executes DMA transfer of the acoustic data.

As another example, it is also made possible to store data for a given time so that loss of continuity of data caused by interruption of data because of vibration of the vehicle or for any other reason can be recovered and the data can be played back.

In the description of the embodiments, the PWM signal generator 22 pulse width modulates the carrier signal based on the acoustic data transferred by DMA at a predetermined timing. However, the carrier signal may be pulse width modulated based on the acoustic data input in real time from the external data input section 10.

In the description of the first embodiment, to realize the step-by-step change of the duty ratio, the control section 20 increments or decrements the duty ratio of a square wave of a given period by a given value. However, the change amount of the duty ratio is not limited if the frequency is a frequency outside the auditory area.

In the description of the above embodiments, the acoustic signal generating apparatus 1 is connected to the power amplifier 60 and the power amplifier 60 is connected to the loudspeaker 70. However, the acoustic signal generating apparatus 1 and either or both of the power amplifier 60 and the loudspeaker 70 may be integrated into one body.

In the description of the above embodiments, the low-pass filter 30 is inserted between the PWM signal generator 22 and the signal processing means 40, but may be built in the signal processing means 40.

The embodiments described above are only examples of the invention and the specific configuration of each block can be changed in design as required in the scope in which the functions and the advantages of the invention are produced.

What is claimed is:

1. An acoustic signal generating apparatus comprising:
a PWM signal generator, operable to generate a first pulse signal and to generate a second pulse signal at least one of before and after generating the first pulse signal; and
a low-pass filter, operable to convert the first pulse signal output from the PWM signal generator into a first analog acoustic signal, and to convert the second pulse signal output from the PWM signal generator into a second analog acoustic signal,
wherein a potential level of the first acoustic signal is changeable in a predetermined range between a first potential level and a second potential level higher than the first potential level based on a duty ratio of the first pulse signal;
wherein a potential level of the second acoustic signal is changeable in the predetermined range based on a duty ratio of the second pulse signal;
wherein the PWM signal generator gradually changes the duty ratio of the second pulse signal such that the potential level of the second analog acoustic signal is smoothly changed from one of the first potential level and the second potential level to a center potential level in the predetermined range, or is smoothly changed from the center potential level to one of the first potential level and the second potential level; and
wherein the first analog acoustic signal has an audible frequency and the second analog acoustic signal has an inaudible frequency.

2. The acoustic signal generating apparatus as set forth in claim 1, wherein the PWM signal generator gradually increases the duty ratio of the second pulse signal before generating the first pulse signal such that the potential level of the second analog acoustic signal is smoothly changed from one of the first potential level and the second potential level to the center potential level.

3. The acoustic signal generating apparatus as set forth in claim 1, wherein the PWM signal generator gradually decreases the duty ratio of the second pulse signal after generating the first pulse signal such that the potential level of the second analog acoustic signal is smoothly changed from the center potential level to one of the first potential level and the second potential level.

4. The acoustic signal generating apparatus as set forth in claim 1, further comprising an oscillator operable to generate a carrier signal having a predetermined frequency,
wherein the PWM signal generator executes pulse width modulation on the carrier signal based on acoustic data which is input by DMA transfer, thereby generating the first pulse signal.

5. An acoustic signal generating apparatus comprising:
a PWM signal generator, operable to generate a first pulse signal and a second pulse signal at least one of before and after generating the first pulse signal;
a low-pass filter, operable to convert the first pulse signal output from the PWM signal generator into a first analog acoustic signal, and to convert the second pulse signal output from the PWM signal generator into a second analog acoustic signal,
wherein a potential level of the first acoustic signal is changeable in a predetermined range based on a duty ratio of the first pulse signal;
wherein a potential level of the second acoustic signal is changeable in the predetermined range based on a duty ratio of the second pulse signal;
wherein the PWM signal generator continuously generates one of the first pulse and the second pulse during the acoustic signal generating apparatus is activated;
wherein the PWM signal generator maintains the duty ratio of the second pulse signal at 1/2 such that the potential level of the second acoustic signal is maintained at a center potential level in the predetermined range; and
wherein the first analog acoustic signal has an audible frequency and the second analog acoustic signal has an inaudible frequency.

6. The acoustic signal generating apparatus as set forth in claim 5, further comprising an oscillator operable to generate a carrier signal having a predetermined frequency,
wherein the PWM signal generator executes pulse width modulation on the carrier signal based on acoustic data which is input by DMA transfer, thereby generating the first pulse signal.

7. An acoustic signal generating apparatus comprising:
a PWM signal generator, operable to generate a pulse signal;
a low-pass filter, operable to convert the pulse signal output from the PWM signal generator into an analog acoustic signal;
a switcher, operable to switch an output terminal of the PWM signal generator between a signal output state and an output high impedance state; and
a voltage regulator, operable to regulate a potential level of the output terminal,
wherein a potential level of acoustic signal is changeable in a predetermined range based on a duty ratio of the pulse signal;
wherein the PWM signal generator generates the pulse signal when the output terminal is in the signal output state;
wherein the voltage regulator maintains the potential level of the output terminal at a center potential level in the predetermined range when the output terminal is in the output high impedance state; and
wherein the switcher switches the output terminal to the output high impedance state at least one of before and after generating the pulse signal.

8. The acoustic signal generating apparatus as set forth in claim 7, further comprising an oscillator operable to generate a carrier signal having a predetermined frequency,
wherein the PWM signal generator executes pulse width modulation on the carrier signal based on acoustic data which is input by DMA transfer, thereby generating the pulse signal.

* * * * *